United States Patent [19]
Macovski

[11] Patent Number: 5,497,090
[45] Date of Patent: Mar. 5, 1996

[54] BANDWIDTH EXTENSION SYSTEM USING PERIODIC SWITCHING

[76] Inventor: Albert Macovski, 2505 Alpine Rd., Menlo Park, Calif. 94025

[21] Appl. No.: 230,503

[22] Filed: Apr. 20, 1994

[51] Int. Cl.$^6$ ........................................ G01V 3/00
[52] U.S. Cl. ............................ 324/322; 324/314
[58] Field of Search ........................... 324/322, 318, 324/314, 300; 128/653.5

[56] References Cited

U.S. PATENT DOCUMENTS

| | | | |
|---|---|---|---|
| 5,051,700 | 9/1991 | Fox | 324/322 |
| 5,166,617 | 11/1992 | Ni | 324/322 |
| 5,172,061 | 12/1992 | Crooks et al. | 324/322 |

Primary Examiner—Louis M. Arana

[57] ABSTRACT

In applications where a tuned coil is used as a receiving antenna, the coil's resistance can produce excessive noise. If a low-loss coil is used, such as with cooled or supercoductive wire, the resulting Q results in inadequate bandwidth. To provide the desired bandwidth without additional losses the coil and its tuning capacitor are periodically de-energized using one or two switches. This sets the signal to substantially zero where it starts again to build up, effectively widening the bandwidth. The resulting signal is synchronously detected to provide the in-phase and quadrature signals. In an NMR system this enables the performance to be limited by sample or object noise. In MRI systems using an oscillating readout bias, the shorting is timed with the transition of the bias waveform.

19 Claims, 3 Drawing Sheets

5,497,090

BANDWIDTH EXTENSION SYSTEM USING PERIODIC SWITCHING

BACKGROUND OF THE INVENTION

1. Field of the invention

This invention relates to systems receiving electromagnetic field signals using a coil as a pickup antenna. A major application is NMR and MRI systems where a high-Q coil is used to pick up the magnetic fields resulting from the precessing moments.

2. Description of Prior Art

In some applications, principally magnetic resonance systems, a coil is used to pick up the electromagnetic field signals with the coil acting as an antenna. The coil resistance is often the major source of noise in the system and dominates the performance. To avoid this noise, some systems have used superconductive high-Q coils. Such a system is described in M. R. Bendall and D. T. Pegg, *J. Magn. Res.* 67, 376 (1986) and in R. Black et al., *Science* 259, 793 (1993).

The problem with this approach is that the high Q coil and its associated tuning capacitor results in a very narrow bandwidth, inadequate for typical magnetic resonance imaging systems. The bandwidth is particularly inadequate for high-speed MRI systems. As a result, these systems use various matching systems which compromise the SNR (signal to noise ratio). In an ideal system the body noise will dominate the coil noise. This is particularly difficult to achieve in systems which receive at a relatively low frequency. One example of MRI systems which receive at low frequencies are pulsed MRI systems which use a strong polarizing fields and a relatively low readout bias field. Systems of this type are described in U.S. Pat. No. 5,057,776 by the same inventor, in a paper "Novel Approaches to Low-Cost MRI", A. Macovski and S. Conolly, MRM 29:1–10 (1993) and in a paper by B. Favre, J.Bonche, H. Mehier, J. Peyrin, *Magn. Reson. Med.* 13, 299–304 (1990).

In the invention to be described, a high-Q coil is used as an antenna. To provide the desired bandwidth the coil is periodically de-energized with the signal allowed to build up. A somewhat related operation takes place in digital receiving systems which use matched filters. Here, in some cases, the matched filter is implemented using a shorted tuned circuit. Here, however, the coil is not used as an antenna and narrow bandwidth is not an issue. A system of this type is described in Digital Communications by Simon Haykin, Wiley 1988, pages 90–92. The coil is not the pickup antenna. A wideband digital signal is applied to the coil which is periodically shorted out to act as a matched filter.

SUMMARY OF THE INVENTION

An object of this invention is to provide the desired bandwidth in systems using a high-Q receiving coil as an antenna.

A further object of this invention is to provide improved signal-to-noise ratio in systems experiencing noise from the pickup coil.

A further object of this invention is to provide a simpler MRI system receiving the signals at relatively low frequencies while providing adequate bandwidth.

A further object of this invention is to enable MRI systems using an oscillating bias to receive in-phase and quadrature signals with a single pickup coil.

Briefly, in accordance with the invention, a high-Q coil is used as a pickup antenna to provide minimal coil losses and noise. Switches across the tuning capacitor and in series with the coil are used to periodically de-energize the tuned circuit, allowing it to build up between switchings. The resultant samples of the signal represent an effectively widened spectrum, enabling the reception of broadband signals with high signal-to-noise ratio.

BRIEF DESCRIPTION OF THE DRAWINGS

For a more complete description of the invention reference can be made to the following detailed description of several illustrative embodiments thereof which is given in conjunction with the accompanying drawings of which.

DESCRIPTION OF THE PREFERRED EMBODIMENT

Figure 1:
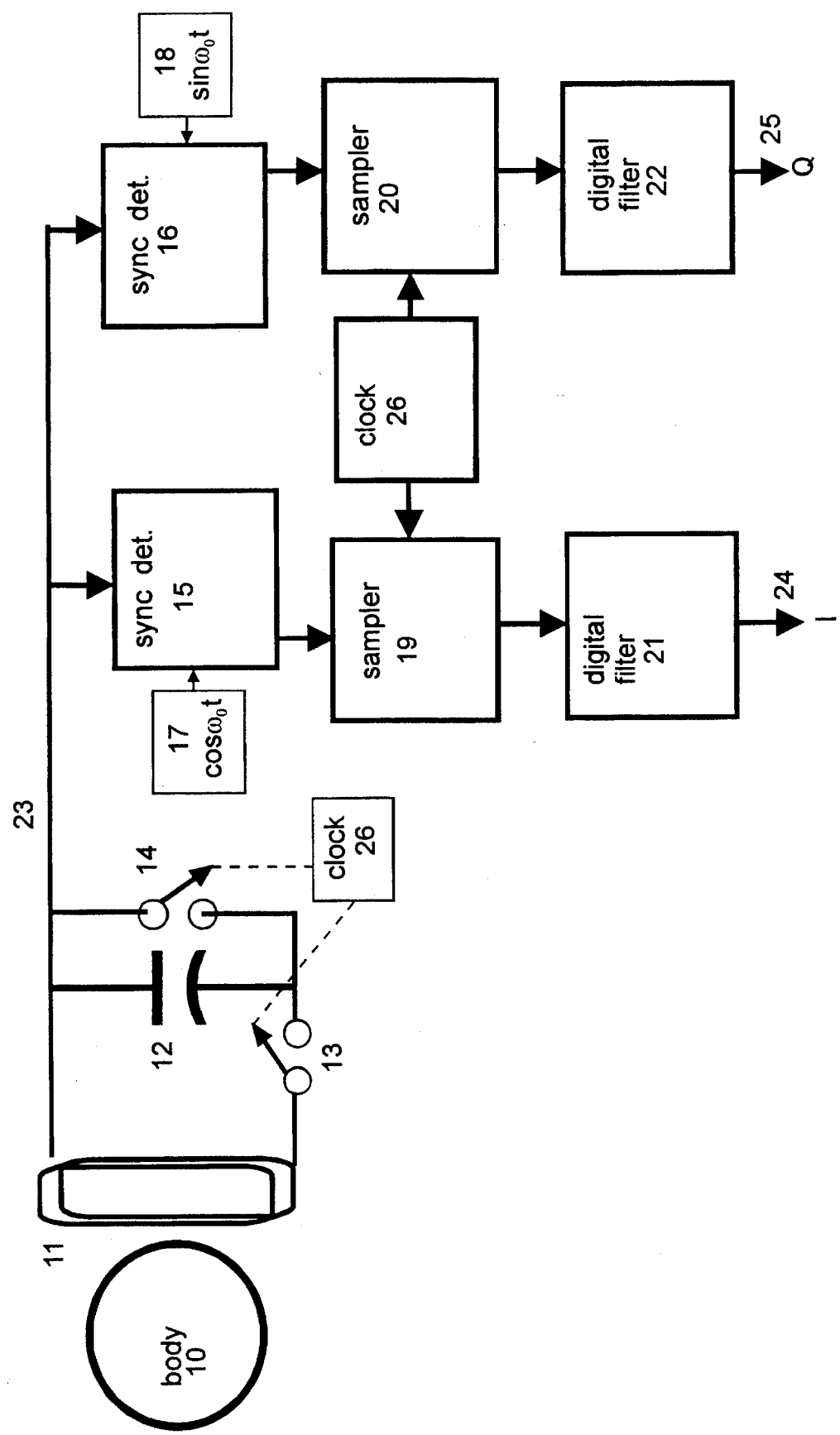
FIG. 1 is a block diagram of an embodiment of the invention.

An understanding of the broad aspects of the invention may best be had by reference to FIG. 1. Here it is desired to pick up electromagnetic fields in coil 11. These could be fields from a radio transmitter or from magnetic resonance precessing moments from object 10. To avoid excessive noise, a high-Q low-loss coil is used for coil 11. As a result, the tuned circuit formed by coil 11 and capacitor 12 forms a very narrow band circuit which cannot receive the broader band signals such as those emanating from object 10. The coil 11 and capacitor 12 are tuned to the center frequency of the desired signal.

Figure 2:
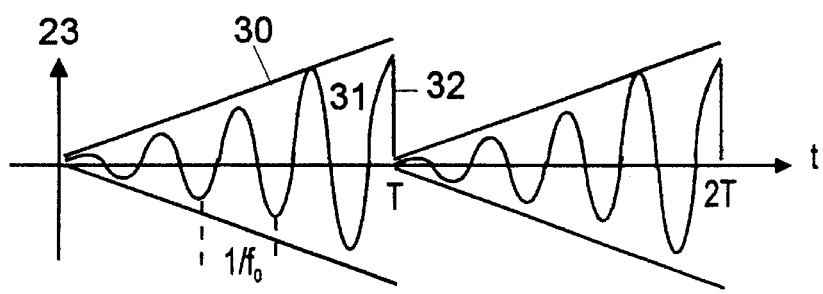
FIG. 2 is a waveform of the embodiment of the invention.

Switch 13 remains shorted and switch 14 open during the reception of signals. To restore the desired bandwidth the tuned circuit 11 and 12 are periodically de-energized by opening switch 13 and shorting switch 14. The associated waveform of signal 23 is shown in FIG. 2. Assuming a very high-Q tuned circuit, signal 23, as represented by waveform 31, will have an essentially linearly rising envelope 30. At the time T the switch 14 is shorted and 13 opened causing signal 23 to drop to zero as shown by waveform segment 32. The switches are almost immediately opened and shorted respectively, after which the waveform repeats itself with the same pattern. During each time segment of duration T, the tuned circuit integrates the signal being picked up by coil 11 and, at the peak of the envelope, provides a sample of the integrated result.

Figure 3:
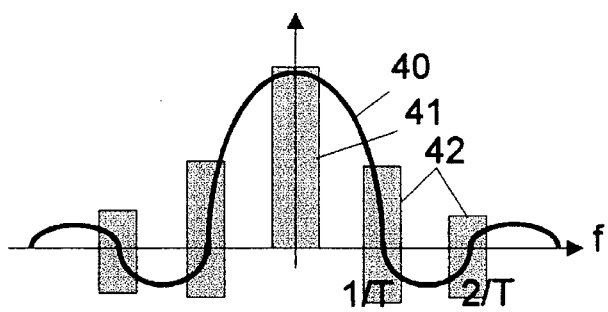
FIG. 3 is a spectrum of an embodiment of the invention illustrating the system bandwidth.

Effectively the circuit in FIG. 1 represents a convolution of the signal modulation with a rectangular waveform rect(t/T), representing integration for a time T. This represents a filtering operation in the frequency domain Tsinc(Tf) as shown in curve 40 in FIG. 3. Thus the de-energizing operation has provided an effective bandwidth of approximately ½T without using a noisy resistor. The sampling rate is 1/T, resulting in some aliasing. This aliasing can cause some excessive noise by folding higher frequency noise into the lower frequency region. However, if the samples are applied to a digital FIR (finite impulse response) filter, shown as 21 and 22 in FIG. 1, the aliasing can be made negligible. Assuming the bandwidth of the FIR filter is made less than ½T, as shown by region 41, the aliased regions are shown as regions 42. Since noise power varies as the integral of the square of the filter function, these regions will contribute negligible noise power. Thus the desired bandwidth is achieved without sacrificing the SNR.

Figure 4:
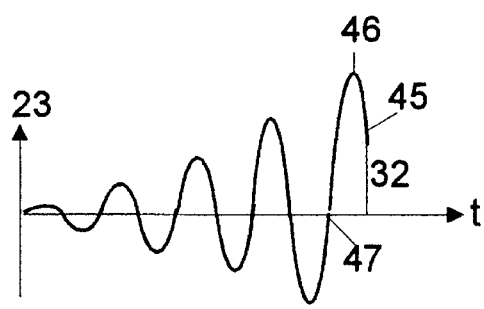
FIG. 4 is a waveform of an embodiment of the invention.

In some cases, it may be desirable to use just a single switch to de-energize o the tuned circuit. This can be due to economic reasons or to avoid losses due to non-ideal switches. With signals not exhibiting phase changes, as in conventional AM signals, this is clearly possible. For example, as shown in FIG. 4, if switch 14 is shorted at time 46 when all of the energy is in the capacitor, switch 13 is not required and can be replaced by a conductor. Similarly if switch 13 is opened at time 47 when all of the energy is in the coil, switch 14 is not required. In each of these cases time T is made a multiple of the carrier period. If a signal with phase changes is used, however, the switching time can occur at time 45 where the energy is divided between coil and capacitor and both switches are used.

Figure 5:
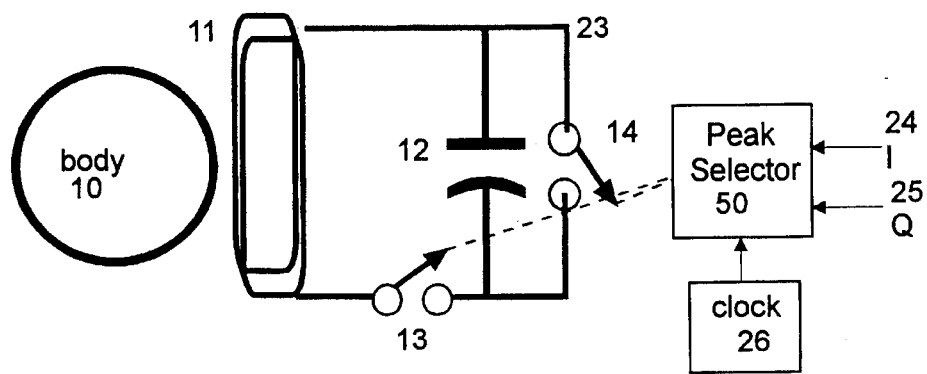
FIG. 5 is a block diagram of an alternate embodiment of the invention.

In this latter case a single switch system can still be used as shown in FIG. 5. Here each switching time is made to slightly depart from T to cause it to occur at a peak as with 46 or a zero as with 47. To determine the phase, the I and Q signals are applied to peak selector 50 which calculates $\tan^{-1}(I/Q)$ and determines the switching time.

Figure 6:
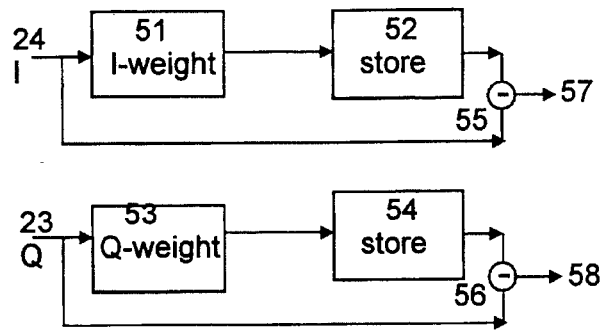
FIG. 6 is a block diagram for correcting the output signal due to an imperfect switch.

Thusfar it has been assumed that the switches are ideal. However, the finite resistance of the switches and the finite switching interval can result in incomplete de-energizing. For example, if switch 14 has a series resistance r, and the switch is shorted for a time period $\tau$, the remaining signal following the shorting operation will approximately be the fraction $\exp(-\tau/rC)$ of the original signal. Similarly, with switch 13, the fraction remaining will be $\exp(-\tau R/L)$ where R is the off resistance of switch 13. The remnant voltage across the capacitor represents a remnant in-phase or I signal while the remnant current in the coil represents the Q signal. These errors can be corrected as shown in FIG. 6. These remnant error signals will essentially persist for the duration T because of the high Q of the tuned circuit. Therefore, they need to be corrected prior to the next sample. I and Q signals 24 and 25 are first weighted by the corresponding fractions indicated above using weights 51 and 53 and then stored in 52 and 54 to provide signals substantially equal to the errors. These stored signals are subtracted in subtractors 55 and 56 to provide corrected signals 57 and 58.

A lossy switch with resistance can also be used to enable the use of a single switch. For example, if switch 14 is lossy, and is left on sufficiently long, it will de-energize both coil 11 and capacitor 12 since it forms a highly damped tuned circuit. However, this can result in a longer switching time $\tau$, thus losing a greater portion of the incoming signal.

Figure 7:
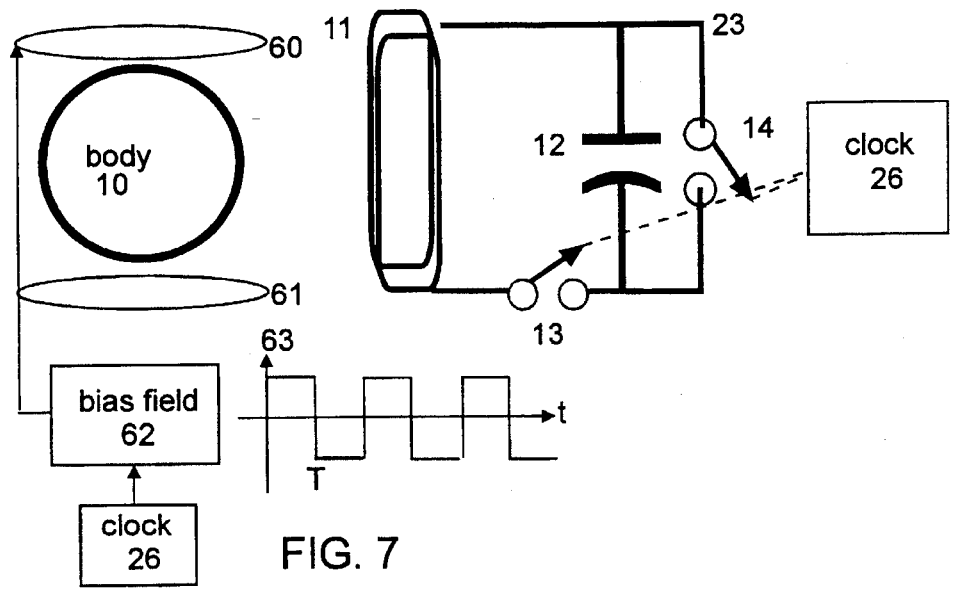
FIG. 7 is a block diagram of an MRI system with a periodic readout bias used in an embodiment of the invention.

As indicated, one of the applications of this system is low-field magnetic resonance imaging where, because of reduced body losses, the coil losses can dominate. In some of these low field systems the readout magnetic field, or bias field, is periodically oscillated to avoid the buildup of phase errors due to inhomogeniety. Using a narrow band receiver, this oscillating bias causes one of the two quadrature components to be suppressed because it reverses in polarity and the narrow-band circuit cannot follow the reversals because of its inherent inertia. Here, in addition to providing the desired bandwidth, this periodic de-energizing system also solves that problem. As shown in FIG. 7, the de-energizing operations are timed to occur during the transitions of the oscillating bias waveform. Here the readout field 63 is created by coils 60 and 61 driven by generator 62. Clock 26 controls both switches 13 and/or 14 and generator 26 to insure that the de-energizing time coincides with the transitions of the oscillating bias field. In this case, the inertia of the tuned circuit is deactivated so that the next signal is not suppressed.

The switches shown can be realized with a wide variety of devices including transistors, silicon-controlled rectifiers, power diodes etc. In general, for switch 14, the off resistance of the switch should be high compared to that of the parallel impedance of the tuned circuit which is given by $Q^2 r$ where r is the series resistance of the coil, assuming the capacitor to be lossless. For switch 13 the on resistance of the switch should be low compared to series resistance of the coil. For switch 14, the requirements for the switch can be altered by placing it across a part of the tuned circuit using an inductive or capacitive tap.

What is claimed is:

1. In a method for receiving an electromagnetic field signal using a high-Q low-loss coil tuned with a capacitor to form a tuned circuit tuned to the frequency of the signal the steps of:

periodically de-energizing the tuned circuit to substantially remove the signal whereby the effective bandwidth of the tuned circuit is substantially increased and;

detecting the resulting signal.

2. The method as described in claim 1 where the signal contains in-phase and quadrature components and the step of detecting includes the step of synchronously demodulating the in-phase and quadrature components.

3. The method as described in claim 1 where the step of de-energizing includes the step of shorting the capacitor using a shorting switch.

4. The method as described in claim 1 where the step of de-energizing includes the step of open-circuiting the coil using an opening switch.

5. The method as described in claim 2 including the step of modifying the de-energizing time using the detected in-phase and quadrature components to insure that the energy is substantially totally in the coil or in the capacitor whereby the de-energizing operation can be accomplished with a single switch.

6. The method as described in claim 3 where the switch is imperfect and a remnant signal remains following the switching operation including the step of estimating the remnant signal component using previously detected signal components and using the measurements to correct the subsequent signal components.

7. The method as described in claim 4 where the switch is imperfect and a remnant signal remains following the switching operation including the step of estimating the remnant signal component using previously detected signal components and using the measurements to correct the subsequent signal components.

8. The method as described in claim 1 where the electromagnetic field signal is a magnetic resonance signal from a magnetic resonance system having an oscillating magnetic readout field including the step of timing the de-energizing operation with the transitions of the oscillating magnetic readout field whereby polarity reversals of the signal can be tolerated.

9. Apparatus for receiving an electromagnetic field signal using a high-Q low-loss coil tuned with a capacitor to the frequency of the signal comprising:

means for periodically de-energizing the coil and capacitor to substantially remove the signal whereby the effective bandwidth of the tuned circuit is substantially increased and;

means for detecting the resulting signal.

10. Apparatus as described in claim 9 where the signal contains in-phase and quadrature components and the means for detecting includes means for synchronously demodulating the in-phase and quadrature components.

11. Apparatus as described in claim 9 where the means for de-energizing includes means for shorting the capacitor using a shorting switch.

12. Apparatus as described in claim 9 where the means for de-energizing includes means for open-circuiting the coil using an opening switch.

13. Apparatus as described in claim 9 including means for modifying the de-energizing time using the detected in-phase and quadrature components to insure that the energy is substantially totally in the coil or in the capacitor whereby the de-energizing operation can be accomplished with a single switch.

14. Apparatus as described in claim 11 where the switch is imperfect and a remnant signal remains following the switching operation including means for estimating the remnant signal component using previously detected signal components and using the measurements to correct the subsequent signal components.

15. Apparatus as described in claim 12 where the switch is imperfect and a remnant signal remains following the switching operation including means for estimating the remnant signal component using previously detected signal components and using the measurements to correct the subsequent signal components.

16. Apparatus as described in claim 9 where the electromagnetic field signal is a magnetic resonance signal from a magnetic resonance system having an oscillating magnetic readout field including means for timing the de-energizing operation with the transitions of the oscillating magnetic readout field whereby polarity reversals of the magnetic resonance signal can be tolerated.

17. Apparatus as described in claim 9 where the periodicity of the de-energizing operation is made sufficiently high to insure that all of the signal components of the electromagnetic field signal are substantially included in the resultant signal.

18. Apparatus as described in claim 9 where the coil is superconductive.

19. In a method for receiving an NMR signal from precessing magnetic moments in an object using a high-Q coil as an antenna where the coil is tuned with a capacitor to the precession frequency of the magnetic moments the steps of:

periodically de-energizing the high-Q coil and capacitor to effectively increase its bandwidth substantially without adding losses and;

synchronously detecting the resulting signal to provide the complex amplitude of the NMR signal.

\* \* \* \* \*